(12) United States Patent
Quan

(10) Patent No.: US 9,799,780 B2
(45) Date of Patent: Oct. 24, 2017

(54) SOLAR CELL AND MANUFACTURE METHOD THEREOF

(71) Applicant: ZEZHI INTELLECTUAL PROPERTY SERVICE, Shenzhen (CN)

(72) Inventor: Wenguang Quan, Shenzhen (CN)

(73) Assignee: ZEZHI INTELLECTUAL PROPERTY SERVICE, Shenzhen (CN)

( * ) Notice: Subject to any disclaimer, the term of this patent is extended or adjusted under 35 U.S.C. 154(b) by 0 days.

(21) Appl. No.: 15/176,184

(22) Filed: Jun. 8, 2016

(65) Prior Publication Data

US 2016/0284884 A1    Sep. 29, 2016

Related U.S. Application Data

(63) Continuation of application No. PCT/CN2013/089949, filed on Dec. 19, 2013.

(51) Int. Cl.
*H01L 31/0216* (2014.01)
*H01L 31/18* (2006.01)
*H01L 31/0224* (2006.01)

(52) U.S. Cl.
CPC .......... *H01L 31/02168* (2013.01); *H01L 31/022441* (2013.01); *H01L 31/18* (2013.01); *H01L 31/1892* (2013.01); *Y02P 70/521* (2015.11)

(58) Field of Classification Search
CPC .............. H01L 31/18; H01L 31/1892; H01L 31/02168; H01L 31/022441
See application file for complete search history.

(56) References Cited

U.S. PATENT DOCUMENTS

| | | | |
|---|---|---|---|
| 6,114,235 A * | 9/2000 | Foote | H01L 21/0276 257/E21.029 |
| 2003/0175557 A1* | 9/2003 | Anderson | C03C 17/3417 428/698 |
| 2008/0213602 A1* | 9/2008 | Morita | C09D 143/04 428/447 |
| 2013/0220400 A1* | 8/2013 | Kim | H01L 31/022425 136/246 |

* cited by examiner

*Primary Examiner* — Susan D Leong
(74) *Attorney, Agent, or Firm* — Hemisphere Law, PLLC

(57) ABSTRACT

A solar cell is provided, including a substrate, a doped emitter layer, a composite anti-reflective layer, a first electrode, a second electrode, a third electrode and a rear electric field layer, the substrate has a first surface and a second surface opposite to the first surface, the first surface is a light incident surface, the doped emitter layer includes a plurality of convexities disposed on the first surface, the composite anti-reflective layer is formed by combination of a plurality of membranous layers and disposed on the doped emitter layer, the first electrode is disposed on a side of the first surface, the second electrode and the third electrode are disposed on a side of the second surface, the second electrode is a bus electrode, the third electrode is a rear electrode, the rear electric field layer is disposed on the second surface and coupled electrically with the third electrode.

3 Claims, 2 Drawing Sheets

SOLAR CELL AND MANUFACTURE METHOD THEREOF

FIELD OF THE DISCLOSURE

The disclosure relates to a cell, and more particularly to a solar cell and a manufacture method thereof.

BACKGROUND OF THE DISCLOSURE

More attention has been laid upon a potential induced degradation (PID) effect of photovoltaic modules along with a wide application of photovoltaic modules, especially after photovoltaic modules having been applied in some large photovoltaic plants for three or four years. Resisting PID is becoming a critical factor of modules in some countries and territories gradually. The trends ask more and more photovoltaic plants, photovoltaic cell plants, photovoltaic module plants, inspection bodies and material suppliers to pay attention to studies of the PID effect.

Solar cells in general employ polyethylene vinyl acetate (EVA) as a packaging material; to reduce the PID effect, in a conventional technique, other substitutional packaging materials whose impedance is higher than that of EVA are introduced; however, the method may increases costs of solar cells.

SUMMARY OF THE DISCLOSURE

According to the previous situation, it is necessary to provide a solar cell with high cell efficiency and low costs as well as a manufacture method thereof.

A solar cell, including a substrate, a doped emitter layer, a composite anti-reflective layer, a first electrode, a second electrode, a third electrode and a rear electric field layer, the substrate has a first surface and a second surface opposite to the first surface, the first surface is a light incident surface, the doped emitter layer includes a plurality of convexities disposed on the first surface, the composite anti-reflective layer is formed by combination of a plurality of membranous layers and disposed on the doped emitter layer, the first electrode is disposed on the same side with the first surface, the second electrode and the third electrode are disposed on the same side with the second surface, the second electrode is a bus electrode, the third electrode is a rear electrode, the rear electric field layer is disposed on the second surface and coupled electrically with the third electrode.

An index of refraction of the composite anti-reflective layer is 2.01~2.11.

The composite anti-reflective layer includes a first membranous layer, a second membranous layer and a third membranous layer, the first membranous layer and the doped emitter layer are connected, the first membranous layer is an ion diffusion barrier layer, the second membranous layer and the third membranous layer are disposed above the first membranous layer, and the second membranous layer is disposed between the first membranous layer and the third membranous layer.

A thickness of the first membranous layer is less than that of the second membranous layer and that of the third membranous layer respectively.

A thickness of the first membranous layer is 5-50 nm, a thickness of the second membranous layer is 50-80 nm, a thickness of the third membranous layer is 50-150 nm.

The substrate is a P-type doping silicon wafer, the doped emitter layer is a $N^+$ doping emitter layer.

A manufacture method of the solar cell above includes forming a plurality of convexities on a first surface of a substrate, the substrate has the first surface and a second surface opposite to the first surface; forming a phosphorus glass layer on the first surface of the substrate to cover the convexities; making the convexities to form a doped emitter layer; removing the phosphorus glass layer; forming a composite anti-reflective layer on the doped emitter layer; forming a first electrode on a side of the first surface of the substrate, forming a second electrode and a third electrode on a side of the second surface; and forming a rear electric field layer coupling with the third electrode electrically.

The composite anti-reflective layer is formed by chemical vapor deposition.

A first membranous layer of the composite anti-reflective layer is a silicon-rich silicon nitride film, parameters of the chemical vapor deposition are as follows: a temperature is 400-450° C., a range of power is 6-8 KW, a gas flow of silane is 600-2000 sccm, a gas flow of ammonia is 4-7 slm, a gas flow of nitrogen is 5-10 slm, a percentage of the gas flow of silane in total amount of gas is 12~40%.

The rear electric field layer is formed by sintering.

The previous solar cell includes a composite anti-reflective layer and a rear electronic field layer, which can mitigate or even eliminate the PID effect, in order to improve efficiency of the solar cell. Moreover, a solar cell produced by the manufacture method of a solar cell above can fulfill the requirement of PID test without changing the EVA packaging material or increasing steps or processes in manufacture, costs can be reduced.

DETAILED DESCRIPTION OF PREFERRED EMBODIMENTS

Embodiments are described in detail with reference to the accompanying drawings as follows to illustrate a manufacture method of a solar cell of the disclosure.

The manufacture method of a solar cell according to an embodiment of the disclosure includes following steps.

Figure 1:
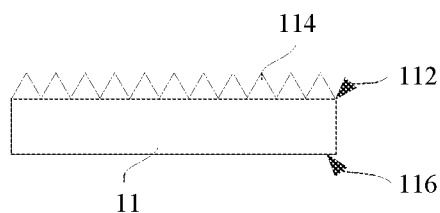
FIG. 1 through FIG. 5, FIG. 7 and FIG. 8 are schematic views of each step of a manufacture method of a solar cell according to an embodiment the disclosure.

Referring to FIG. 1, first a plurality of convexities 114 are formed on a first surface 112 of the substrate 11. Specifically speaking, the substrate 11 can be a P-type doping silicon wafer, the substrate 11 has a first surface 112 and a second surface 116 opposite to the first surface 112. The first surface 112 is a light incident surface, the second surface 116 can be a shady surface, the first surface 112 of the substrate 11 can be cleansed before forming the plurality of convexities 114. The convexities 114 can be triangular columnar convexities.

Figure 2:
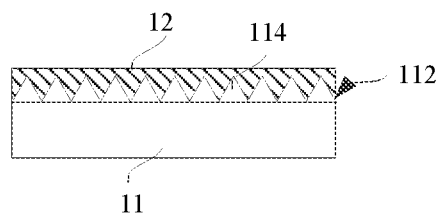

Referring to FIG. 2, second, a phosphorus glass layer 12 is formed on the first surface 112 of the substrate 11 to cover the convexities 114.

Figure 3:
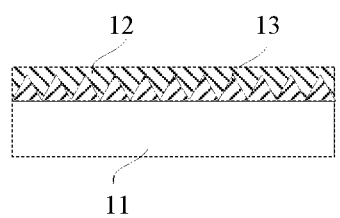

Referring to FIG. 3, third, the convexities 114 are made to form a doped emitter layer 13 by diffusion. Specifically speaking, a diffusion method is for example to make substances to diffuse and enter inside of the convexities 114 to form the doped emitter layer 13 in a furnace tube process, such as to form a $N^+$ doping emitter layer.

Figure 4:
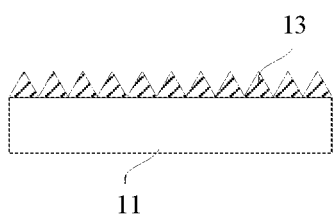

Referring to FIG. 4, fourth, the phosphorus glass layer 12 is removed. Specifically speaking, margins can be insulated and the phosphorus glass layer 12 can be removed by etching, such as wet etching or dry etching.

Figure 5:
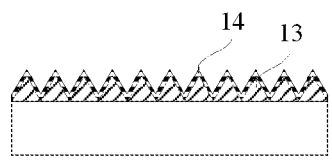
Figure 6:
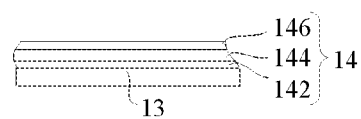
FIG. 6 is an enlarged view of a composite anti-reflective layer of a solar cell according to an embodiment the disclosure.

Referring to FIG. 5, fifth, a composite anti-reflective layer 14 is formed on the doped emitter layer 13. Specifically speaking, the composite anti-reflective layer 14 can be formed by chemical vapor deposition, such as plasma enhanced chemical vapor deposition. Specifically speaking, referring to FIG. 6 as well, the composite anti-reflective layer 14 can include a first membranous layer 142, a second membranous layer 144 and a third membranous layer 146. The first membranous layer 142 and the doped emitter layer 13 are connected, the first membranous layer 142 is an ion diffusion barrier layer, whose structure is compact to prevent sodium ions from diffusing to an interface of the composite anti-reflective layer 14 and the doped emitter layer 13, and further to prevent formation of a leakage path caused by sodium ion diffusion. The second membranous layer 144 and the third membranous layer 146 are disposed above the first membranous layer 142, the second membranous layer 144 is disposed between the first membranous layer 142 and the third membranous layer 146. The first membranous layer 142 can include amorphous silicon, a silicon-rich silicon nitride film, a silicon-rich silicon oxide film and a silicon-rich silicon oxynitride film. A silicon-rich silicon nitride film is taken as an example, parameters of its chemical vapor deposition are as follows: a temperature is 400-450° C., a range of power is 6-8 KW, a gas flow of silane ($SiH_4$) is 600-2000 sccm, a gas flow of ammonia ($NH_3$) is 4-7 slm, a gas flow of nitrogen ($N_2$) is 5-10 slm, a percentage of the gas flow of $SiH_4$ in total amount of gas is 12~40%.

For superior reflectivity of the composite anti-reflective layer 14, an index of refraction (n) of the composite anti-reflective layer 14 is preferred in a range of 2.01~2.11. A thickness of the first membranous layer 142 is less than that of the second membranous layer 144 and that of the third membranous layer 146 respectively, a thickness of the first membranous layer 142 is for example 5-50 nm, a thickness of the second membranous layer 144 is for example 50-80 nm, a thickness of the third membranous layer 146 is for example 50-150 nm. Furthermore, the second membranous layer 144 and the third membranous layer 146 can be formed by silicon nitride or silicon oxynitride.

Figure 7:
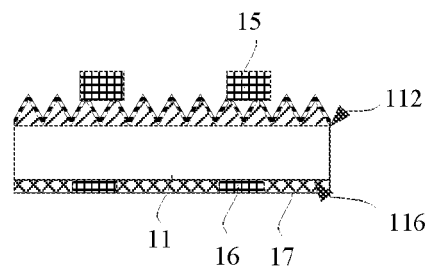

Referring to FIG. 7, sixth, a first electrode 15 is formed on a side of the first surface 112 of the substrate 11, a second electrode 16 and a third electrode 17 are formed on a side of the second surface 116. Specifically speaking, the first electrode 15, the second electrode 16 and the third electrode 17 can be formed by screen printing. The first electrode 15 can include a bus electrode, the bus electrode can be made out of silver paste; the second electrode 16 can be a bus electrode, which can be made out of silver paste; the third electrode 17 can be a rear electrode, which can be made out of aluminum paste.

Figure 8:
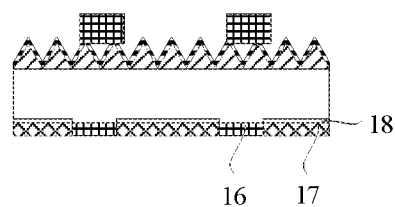

Referring to FIG. 8, seventh, a rear electric field layer 18 is formed, the rear electric field layer 18 and the third electrode 17 are coupled electrically to form a solar cell 100. Specifically speaking, the rear electric field layer 18 can be formed by sintering, the rear electric field layer 18 is for example a $P^+$ rear electric field layer; moreover, the first electrode 15 and the doped emitter layer 13 can be formed to be electric coupling during sintering.

A solar cell produced by the manufacture method of a solar cell above includes a composite anti-reflective layer 14 and a $P^+$ rear electric field layer 18, which can mitigate or even eliminate the PID effect, in order to improve efficiency of the solar cell. Moreover, a solar cell produced by the manufacture method of a solar cell above can fulfill the requirement of PID test without changing the EVA packaging material or increasing steps or processes in manufacture, costs can be reduced.

Above are preferred embodiments of the disclosure, which do not limit the scope of the disclosure, it is understandable in practical to a person skilled in the art that the processes in the method according to the aforesaid embodiments can be accomplished with modifications, equivalent replacements or improvements, which should be covered by the protected scope of the disclosure.

What is claimed is:

1. A solar cell, wherein it comprises a substrate, a doped emitter layer, a composite anti-reflective layer, a first electrode, a second electrode, a third electrode and a rear electric field layer, the substrate has a first surface and a second surface opposite to the first surface, the first surface is a light incident surface, the doped emitter layer comprises a plurality of convexities disposed on the first surface, the composite anti-reflective layer is formed by combination of a plurality of membranous layers and disposed on the doped emitter layer, the first electrode is disposed on the same side with the first surface, the second electrode and the third electrode are disposed on the same side with the second surface, the second electrode is a bus electrode, the third electrode is a rear electrode, the rear electric field layer is disposed on the second surface and coupled electrically with the third electrode, wherein the composite anti-reflective layer comprises a first membranous layer, a second membranous layer and a third membranous layer, the first membranous layer and the doped emitter layer are connected, the first membranous layer is an ion diffusion barrier layer, the second membranous layer and the third membranous layer are disposed above the first membranous layer, and the second membranous layer is disposed between the first membranous layer and the third membranous layer, and a thickness of the first membranous layer is less than that of the second membranous layer and that of the third membranous layer respectively.

2. The solar cell according to claim 1, wherein an index of refraction of the composite anti-reflective layer is 2.01~2.11.

3. The solar cell according to claim 1, wherein the substrate is a P-type doping silicon wafer, the doped emitter layer is a $N^+$ doping emitter layer.

* * * * *